(12) United States Patent
Lin et al.

(10) Patent No.: US 8,053,791 B2
(45) Date of Patent: Nov. 8, 2011

(54) STRUCTURE OF AC LIGHT-EMITTING DIODE DIES

(75) Inventors: Ming-Te Lin, Hsinchu (TW); Fei-Chang Hwang, Hsinchu (TW); Chia-Tai Kuo, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 281 days.

(21) Appl. No.: 12/424,109

(22) Filed: Apr. 15, 2009

(65) Prior Publication Data

US 2009/0218580 A1 Sep. 3, 2009

Related U.S. Application Data

(63) Continuation of application No. 10/994,361, filed on Nov. 23, 2004, now Pat. No. 7,531,843.

(30) Foreign Application Priority Data

Aug. 31, 2004 (TW) .................................. 93126201 A

(51) Int. Cl.
*H01L 33/00* (2010.01)
*H01L 33/62* (2010.01)
(52) U.S. Cl. .................. 257/88; 257/99; 257/E33.001; 257/E33.045; 257/E33.057
(58) Field of Classification Search .................. 257/79, 257/88–103, E33.001, E33.045, E33.057
See application file for complete search history.

(56) References Cited

U.S. PATENT DOCUMENTS

| 5,936,599 | A | 8/1999 | Reymond |
| 5,982,345 | A * | 11/1999 | Takayama et al. ............... 345/76 |
| 6,412,971 | B1 | 7/2002 | Wojnarowski et al. |
| 6,547,249 | B2 | 4/2003 | Collins, III et al. |
| 6,635,902 | B1 * | 10/2003 | Lin ................................. 257/88 |
| 7,009,199 | B2 * | 3/2006 | Hall ................................ 257/14 |
| 7,064,353 | B2 | 6/2006 | Bhat |
| 2004/0023493 | A1 | 2/2004 | Tomoda |
| 2004/0075399 | A1 | 4/2004 | Hall |
| 2004/0080941 | A1 | 4/2004 | Jiang et al. |
| 2004/0165384 | A1 | 8/2004 | Allen |
| 2004/0227148 | A1 | 11/2004 | Camras et al. |
| 2006/0180818 | A1 | 8/2006 | Nagai et al. |

FOREIGN PATENT DOCUMENTS

| JP | 4-174567 | 6/1992 |
| JP | 2000-101136 A | 4/2000 |
| JP | 2002-359402 | 12/2002 |
| JP | 2004-006582 | 1/2004 |
| JP | 2004-079867 | 3/2004 |
| KR | 10-2004-0032360 | 4/2004 |
| TW | 200408148 | 5/2004 |

* cited by examiner

*Primary Examiner* — Marcos D. Pizarro
(74) *Attorney, Agent, or Firm* — Rabin & Berdo, P.C.

(57) ABSTRACT

A structure of light-emitting diode (LED) dies having an AC loop (a structure of AC LED dies), which is formed with at least one unit of AC LED micro-dies disposed on a chip. The unit of AC LED micro-dies comprises two LED micro-dies arranged in mutually reverse orientations and connected with each other in parallel, to which an AC power supply may be applied so that the LED unit may continuously emit light in response to a positive-half wave voltage and a negative-half wave voltage in the AC power supply. Since each AC LED micro-die is operated forwardly, the structure of AC LED dies also provides protection from electrical static charge (ESD) and may operate under a high voltage.

4 Claims, 12 Drawing Sheets

US 8,053,791 B2

STRUCTURE OF AC LIGHT-EMITTING DIODE DIES

CROSS-REFERENCE TO RELATED APPLICATION

The present application is a continuation of application Ser. No. 10/994,361, filed Nov. 23, 2004, which claimed Priority from Taiwanese application No. 093126201, filed Aug. 31, 2004, the entire disclosure of which is incorporated herein by reference.

BACKGROUND OF THE INVENTION

1. Field of Invention

The invention relates to a structure of light-emitting diodes (LED), and particularly to a structure of LED dies with an alternating current (AC) loop (a structure of AC LED dies).

2. Related Art

A light-emitting diode (LED) emits light based on its semiconductive characteristics, in contrast to the heating light-emitting principle of a fluorescent lamp, and is thus called a cold light. The LED provides a number of advantages such as high endurance, long lifetime, compactness, low power consumption and so forth. Furthermore, no pernicious material such as mercury is contained in the LED. Therefore, there are high expectations with respect to the LEDs for being a light source in daily life in the current lighting market.

However, prior LEDs are generally limited in their acceptable power levels. Most LEDs may be fed with only low DC voltages and may be damaged if high voltages or AC voltages are applied thereon. Because of this, a DC voltage conversion circuit is generally used to transform the external power supply used by such LEDs. In operating an LED by use of a low DC voltage, the LED has its characteristic curve of the current-voltage relation, as shown in FIG. 1A. As shown, when the voltage is forwardly applied, the LED is conducted and light is emitted there from. On the other hand, if a reverse voltage is applied, the LED breaks down and no light is emitted. Further, in practical usage the LED is often connected in series or parallel with several such LEDs, such as those used in traffic light apparatuses such as stop light apparatuses. As shown in FIG. 2, the externally supplied AC voltage 11 is first reduced in its level by means of a conversion circuit 12 and then converted into a DC voltage corresponding thereto. Then the converted DC voltage is fed into a plurality of LEDs connected with one another in series or in parallel as mentioned above, in which LEDs cannot be used when reverse power is supplied.

However, once a single LED arranged among the plurality of LEDs is damaged, the set of LEDs in which the damaged LED resides is also likely to become damaged and the whole of the loop formed with the damaged LED included is badly affected. To reduce this occurrence, the number of LEDs connected in series is generally reduced as much as possible. Unfortunately, the total amount of wires used for these LEDs in a specific application is unavoidably increased and the power consumption increases correspondingly. Furthermore, the voltage at an end of one of the wires is insufficient and thus causes uneven luminance of the LEDs.

There is another serious problem with a low DC voltage operated ALInGaN LED. When such a LED is assembled and processed, electrical static discharge (ESD) is apt to occur. When this occurs, an instantaneous high reverse voltage is burst forth and the LED is damaged.

To resolve the above-mentioned shortcomings, circuit assembly and die manufacturing are two generally adopted solutions.

The circuit assembly scheme may be seen in U.S. Pat. No. 6,547,249. This patent discloses an additional diode arranged in a reverse orientation and connected in parallel to protect an LED-based circuit to prevent sudden ESD or an exceptional current or voltage attack. In another U.S. Pat. No. 5,936,599, LEDs in an LED based circuit are arranged in a reverse orientation and connected in parallel, and inductors and capacitors are introduced in the circuit. In this case, an AC voltage and a high voltage may be used by the LEDs. However, although the problem of high power consumption may be overcome by such circuit assembly schemes, the corresponding large volume of the LED based circuit considerably limits its actual applicable range.

An example of the die manufacturing scheme may be seen in U.S. Pat. No. 6,547,249, in which LED dies are manufactured as a matrix form and connections of the LED dies are arranged in the same orientation in series and in parallel. Although such LEDs may be operated with a high voltage, they may still not be applied with an AC voltage. In this patent, an arrangement for protection of breakdown of the LEDs is also provided by connecting a diode with the LEDs in a variety of combinations where the LEDs may also be arranged in mutually reverse orientations and connected with each other but should be disposed over a submount and then connected with the LED matrix in parallel. According to this patent, the LED die 91 has a structure shown in FIG. 1B, and has an equivalent circuit shown in FIG. 1C, in which the LED 91 is connected in parallel with two mutually oriented Zener diodes 92 and 93, or a connection may be provided to form a loop as shown in FIG. 1D. The current-voltage relation curves corresponding to the equivalent circuits in FIG. 1C and FIG. 1D are shown in FIG. 1E and FIG. 1F respectively.

Also referring to U.S. Pat. No. 6,635,902, the LED dies are also manufactured as a matrix form while the LEDs are oriented the same and connected in series. Although the LEDs may be operated with a high voltage, they also have the problem of not being capable of operation with AC voltage.

SUMMARY OF THE INVENTION

An object of the invention is therefore to provide a structure of light-emitting diode (LED) dies having an alternating current (AC) loop abbreviated as a structure of AC LED dies, on which an AC power supply may be applied directly to considerably broaden applicable range.

To achieve the above object, the structure of AC LED dies according to the invention is formed with at least one unit of AC LED micro-dies disposed on a chip. The unit of AC LED micro-dies comprises two LED micro-dies arranged in mutually reverse orientations and connected with each other in parallel, to which an AC power supply may be applied so that the unit of AC LED micro-dies continuously emits light in response to a positive-half wave voltage and a negative-half wave voltage in the AC power supply respectively. Since each AC LED micro-die is operated forwardly, the structure of the AC LED dies also provides protection from electric static charge (ESD) and may operate under a high voltage.

In practical usage, the structure of the AC LED dies may be provided in a flipped form or a faced-up form. Also, each of the LED dies in the structure of the AC LED dies may correspond to the same wavelength or different wavelengths with those of the other LEDs in the unit of AC LED dies. Thus the structure of AC LED dies may be used in a wider applicable range.

The objects, constructions, features and functions of the invention may be better understood through the following detailed description with respect to the preferred embodiments thereof in connection with the accompanying drawings.

DETAILED DESCRIPTION OF THE INVENTION

Figure 1A:
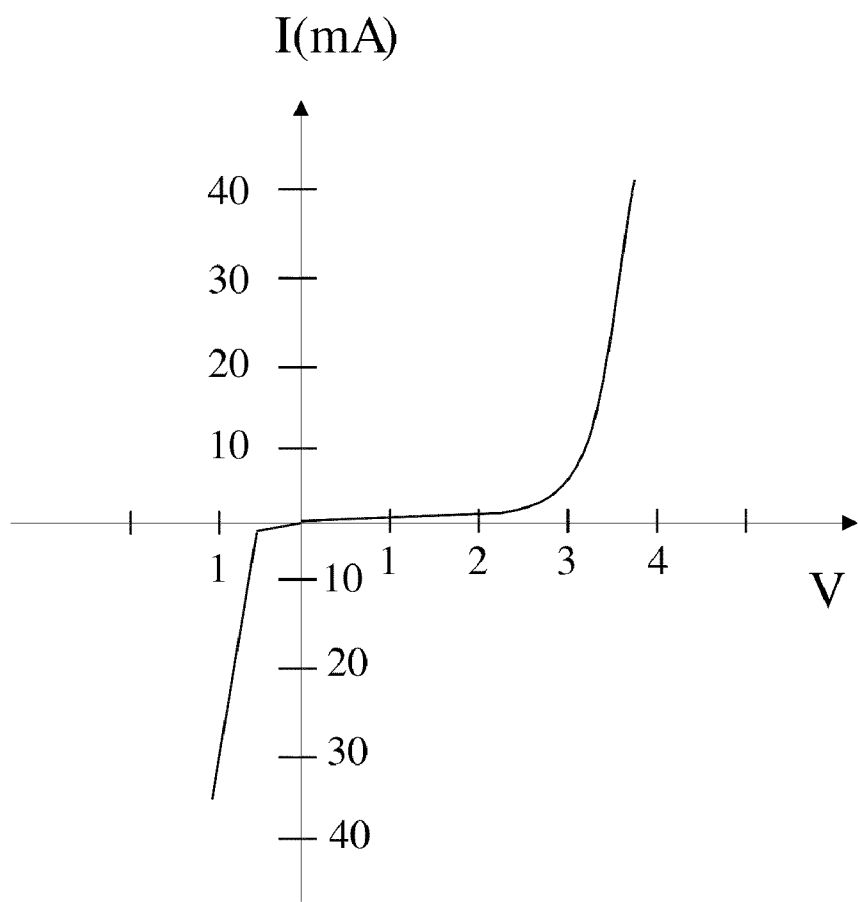
FIG. 1A is a characteristic curve diagram of a prior light-emitting diode (LED) die.
Figure 1B:
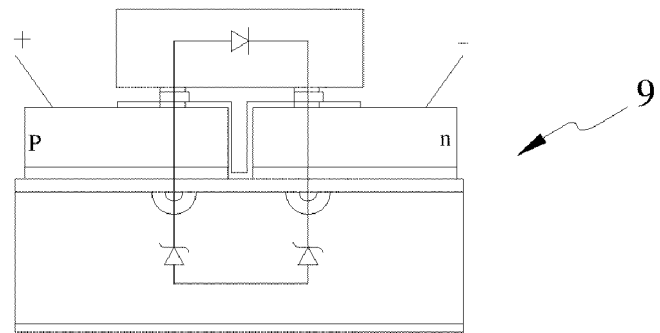
FIGS. 1B-1D are schematic illustrations of a prior LED die produced by Lumileds.
Figure 1C:
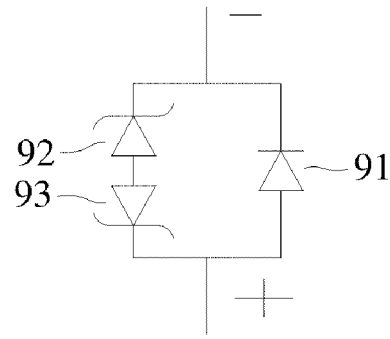
Figure 1D:
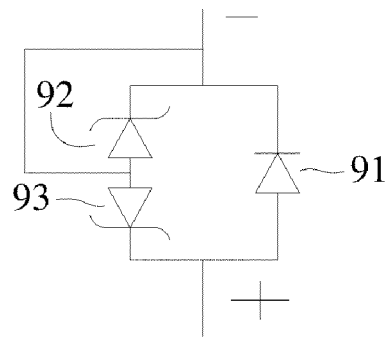
Figure 1E:
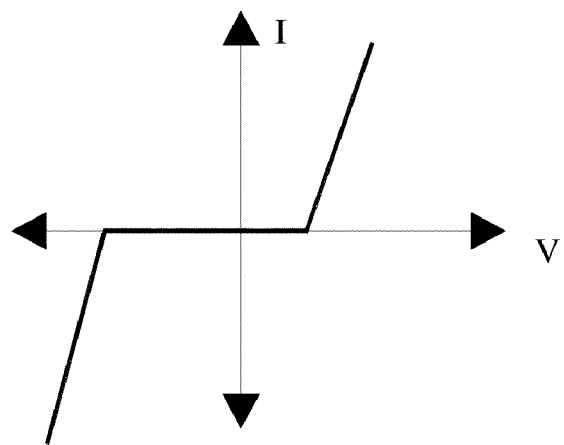
FIGS. 1E-1F are characteristic curve diagrams of the LED die shown in FIGS. 1B-1D.
Figure 1F:
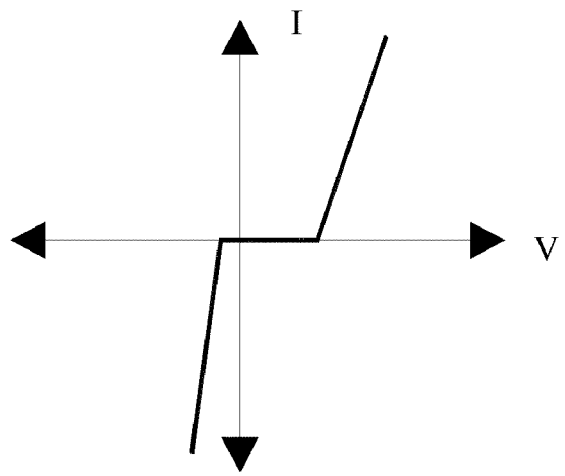
Figure 2:
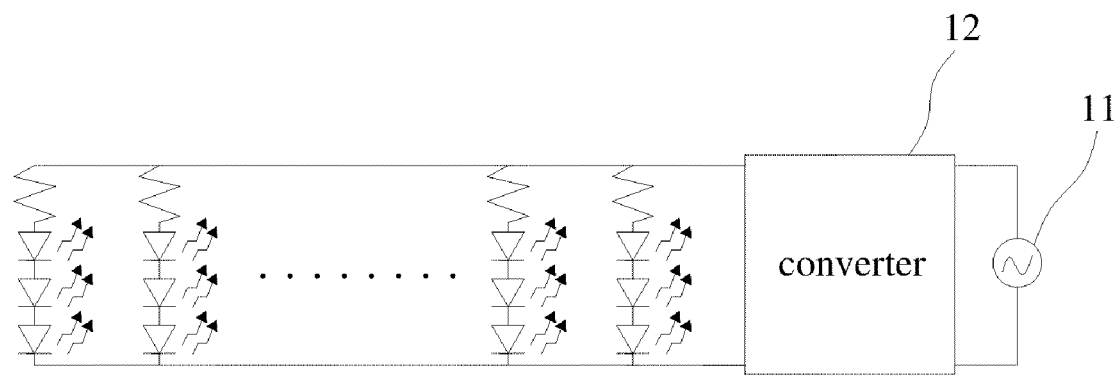
FIG. 2 is an illustration of the prior LED in use.
Figure 3:
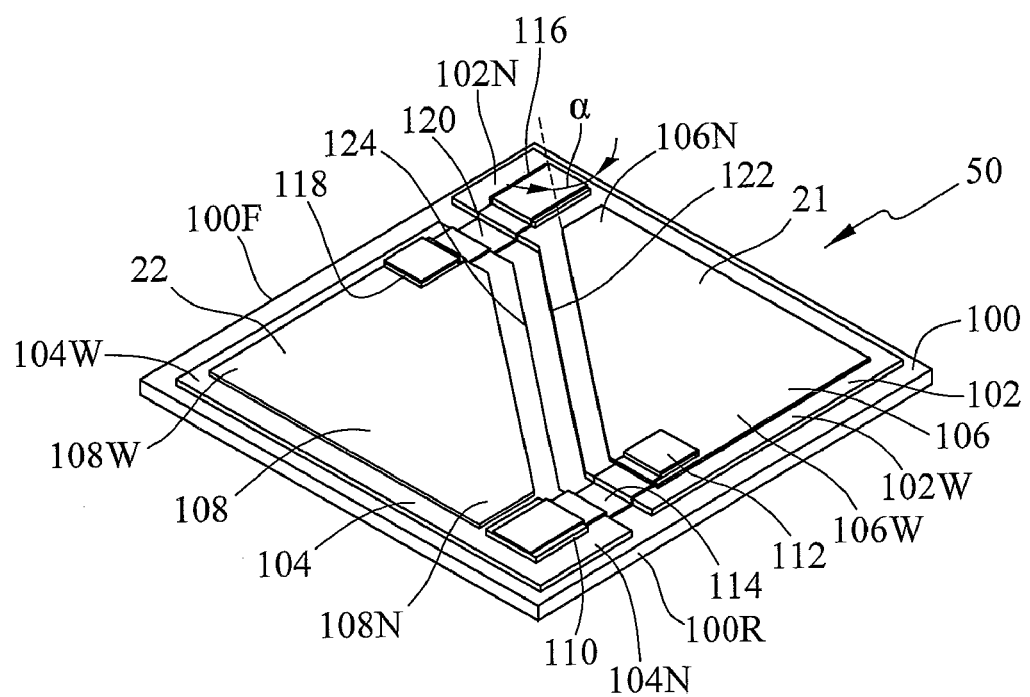
FIG. 3 is a schematic diagram of a structure of LED dies having an alternating current (AC) loop (a structure of AC LED die) according to the invention.
Figure 4A:
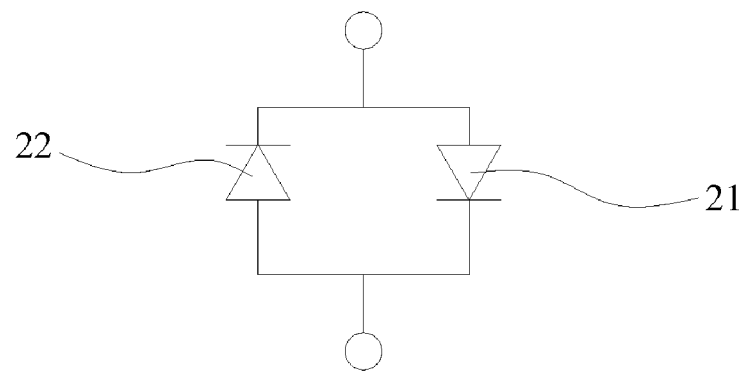
FIG. 4A is an equivalent circuit diagram of the structure of AC LED dies shown in FIG. 3.

A structure of light-emitting diode (LED) dies having an alternating current (AC) loop which may be fed with a direct AC power supply, is disclosed in the invention (abbreviated as a structure of AC LED dies). The structure of AC LED dies comprises at least a unit 50 of AC LED micro-dies, which will be described in the following. Referring to FIG. 3, the unit of AC LED micro-dies comprises a first LED micro-die and a second LED micro-die 21 and 22 arranged in mutually reverse orientations and connected in parallel. The unit of AC LED micro-dies has an equivalent circuit as shown in FIG. 4A. Since the first and second LED micro-dies 21 and 22 are oriented reversely and connected in parallel, the first LED micro-die 21 emits light when a positive-half wave voltage in the AC power supply is applied, while the second LED micro-die 22 emits light when a negative-half wave voltage in the AC power supply is applied. Therefore, the unit of LED micro-dies may emit light continuously whenever a proper AC power supply is provided. For this reason, the above-mentioned terms "AC loop", "AC LED dies" and "AC LED micro-dies" are used.

As is shown in FIG. 3, the unit 50 of micro-dies is fabricated on a substrate 100. Two layers 102 and 104 of a first conductivity type are supported on the substrate and separated from each other. The layer 102 has a wide end 102W and a narrow end 102N. Similarly, the layer 104 has a wide end 104W and a narrow end 102N. Two layers 106 and 108 of a second conductivity type are supported respectively on the two layers 102 and 104 with the first conductivity type. Like the layers 102 and 104, the layers 106 and 108 have wide ends (106W and 108W) and narrow ends (106N and 108N). A rear pad 110 is formed on the layer 104 of the first conductivity type, adjacent its narrow end 104N. A rear pad 112 is formed on the layer 106 of the second conductivity type, adjacent its wide end 106W. A rear conductive bridge 114 connects the rear pads 110 and 112. A front pad 116 is formed on the layer 102 of the first conductivity type, adjacent its narrow end 102N. A front pad 118 is formed on the layer 108 of the second conductivity type, adjacent its end 108W. A front bridge 120 connects the front pads 116 and 118.

As is also shown in FIG. 3, the substrate 100 is rectangular and has two pairs of parallel sides, including front and rear parallel sides 100F and 100R. The micro-die 21 has an edge 122, and an anode (at pad 118) and a cathode (at pad 110) disposed adjacent opposite ends of the edge 122. As FIG. 3 illustrates, the micro-dies 21 and 22 complement each other in shape so as to occupy a substantially rectangular region. The micro-die 22 has an edge 124 and an anode and cathode disposed adjacent opposite ends of the edge 124. The edge 122 is disposed at an acute angle α (illustrated with the aid of a dotted line) to the front and rear edges 100F and 100R. Similarly, the edge 124 is disposed at an acute angle (corresponding to the angle α and illustrated with the aid of a dotted line, but not marked with a reference character in order to avoid cluttering the drawing) with respect to the front and rear edges 100F and 100R.

Figure 4B:
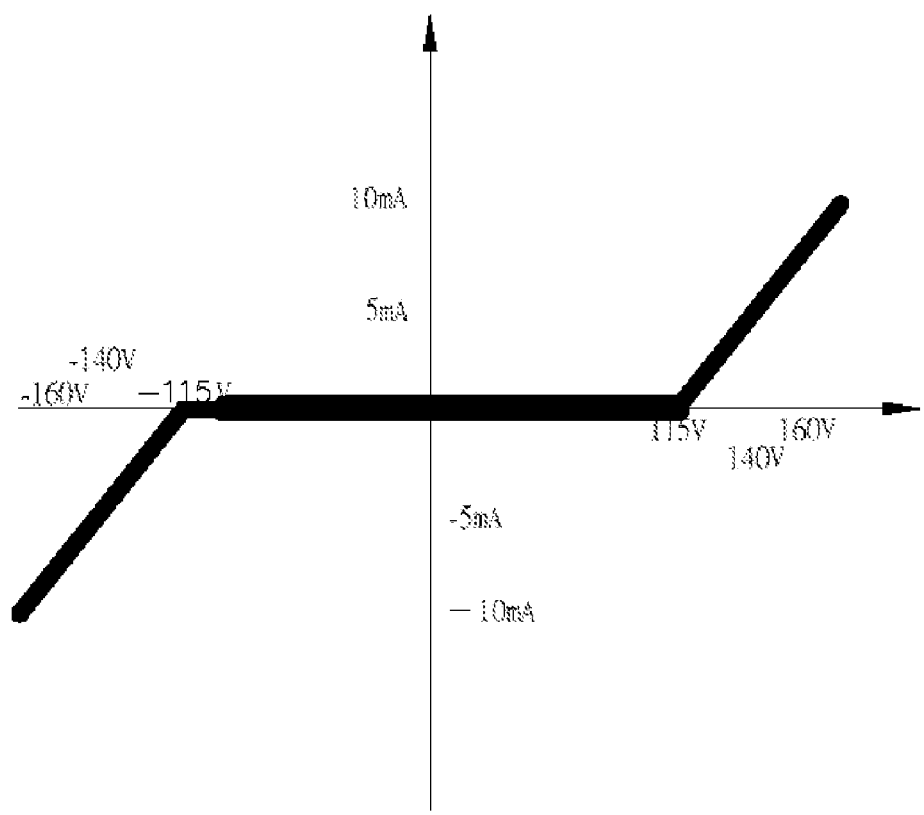
FIG. 4B is a characteristic curve diagram of the structure of AC LED dies shown in FIG. 3.

Furthermore, the characteristic curve associated with the current-voltage relation of the unit of AC LED micro-dies is provided in FIG. 4b. Since each LED micro-die in the unit is operated forwardly, the structure of AC LED dies also provides protection from electric static charge (ESD) without the need of an additional circuit, as in the prior art, or a diode fixed on a sub-mount and connected with the LEDs, as in U.S. Pat. No. 6,547,249. Therefore, the purpose of cost saving may be achieved.

Figure 5:
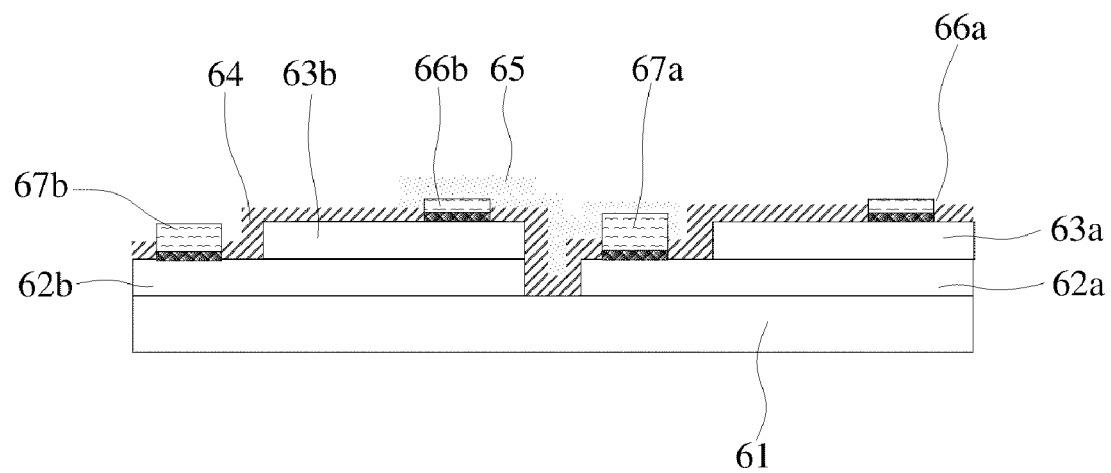
FIG. 5 is a schematic diagram describing a manufacturing of the structure of AC LED dies.
Figure 6:
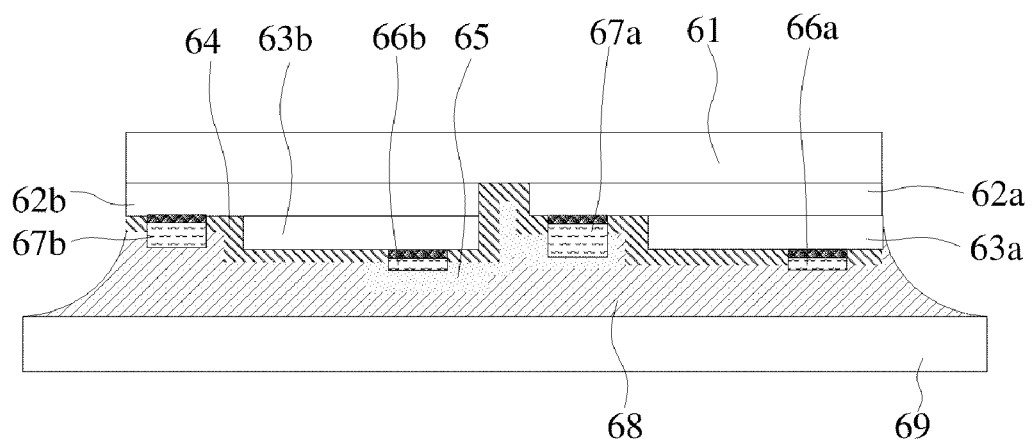
FIG. 6 is a schematic diagram illustrating a package of the structure of AC LED dies shown in FIG. 3.

FIG. 5 illustrates the manufacturing of the structure of AC LED dies in a related embodiment. First, two unconnected n-type light-emitting layers 62a and 62b, such as a n-InGaN layer, are first formed on a substrate 61 made of $Al_2O_3$, GaAs, GaP or SiC, etc. Next, two p-type light-emitting layers 63a and 63b, such as an p-InGaN layer, are formed on portions of the n-type light-emitting layers 62a and 62b respectively. Next, n-type pads 67a and 67b are formed on other portions of the n-type light-emitting layers 62a and 62b respectively. Then, p-type pads 66a and 66b are formed on the p-type light-emitting layers 63a and 63b respectively. Then a conductive bridge 65 is formed to connect the n-type pad 67a and the p-type pad 66b, and an insulating layer 64 is formed to avoid short-circuiting between the n-type pad 67a, the p-type pad 66b and the conductive bridge 65. Finally, the p-type pad 67b is connected to the n-type pad 66a.

Figure 12A:
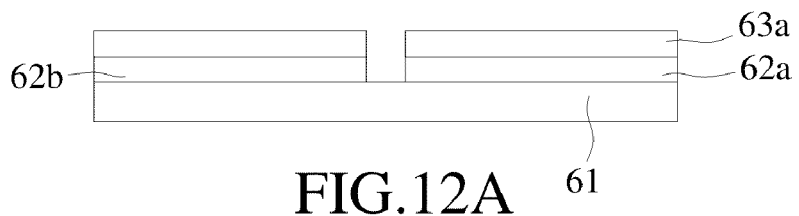
FIGS. 12A-12F are illustrations of a process flow of the manufacturing of the structure of AC LED dies according to the invention.
Figure 12B:
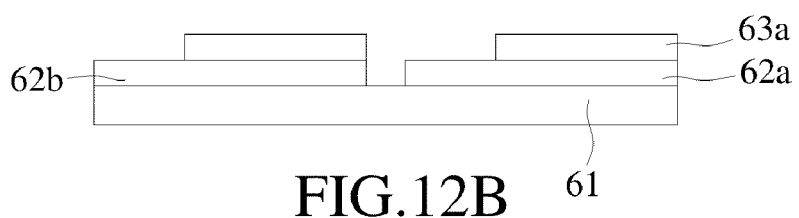
Figure 12C:
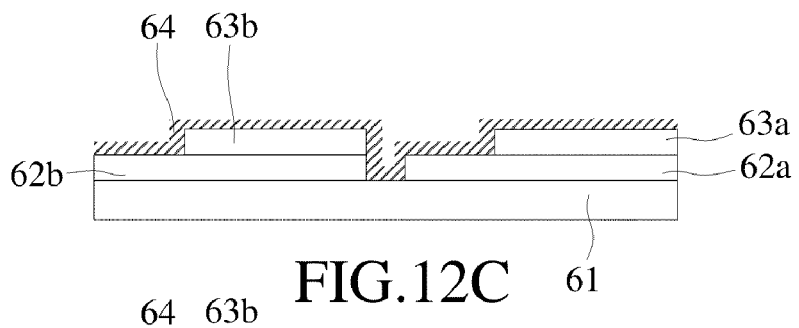
Figure 12D:
Figure 12E:
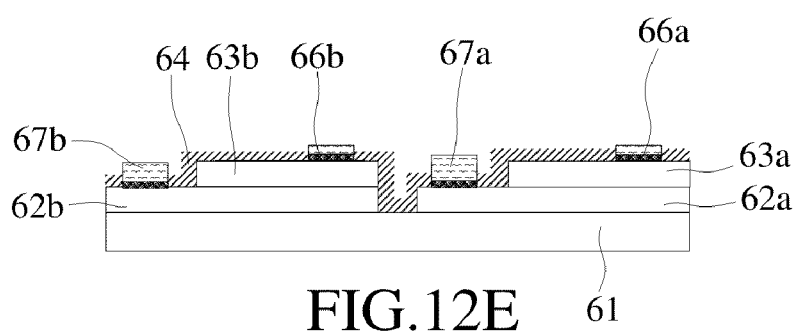
Figure 12F:
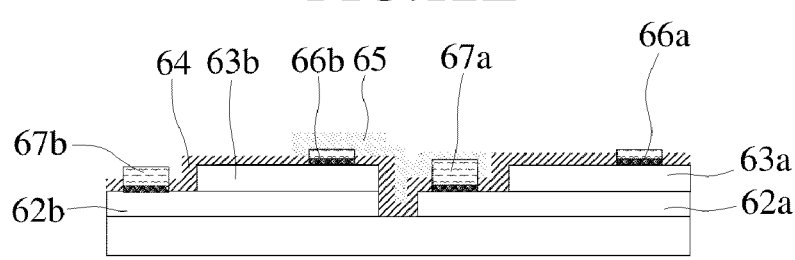

Specifically, the manufacturing of the structure of AC LED dies is illustrated as follows with reference to FIGS. 12A-12F. First, a substrate 61 is provided. On the substrate 61, n-type light-emitting layers 62a and 62b and p-type light-emitting layers 63a and 63b are provided (from bottom to top), as shown in FIG. 12A. Next, an etching operation is performed upon a portion of each of the p-type light-emitting layers 63a and 63b, and a corresponding portion of each of the n-type light-emitting layers 62a and 62b is thus exposed, as shown in FIG. 12B. Next, an insulating layer 64 is formed, as shown in FIG. 12C. The insulating layer 64 may be an oxide layer, for example. Thereafter, specific portions defined for formation of pads in the n-type light-emitting layers 62a and 62b and p-type light-emitting layers 63a and 63b are etched, as shown in FIG. 12D. Then, n-type pads 67a and 67b and p-type pads 66a and 66b are formed at their defined regions as mentioned, as shown in FIG. 12E. Finally, a conductive bridge 65 is formed and connected between the n-type pad 67a and p-type pad 66b, as shown in FIG. 12F.

Figure 7:
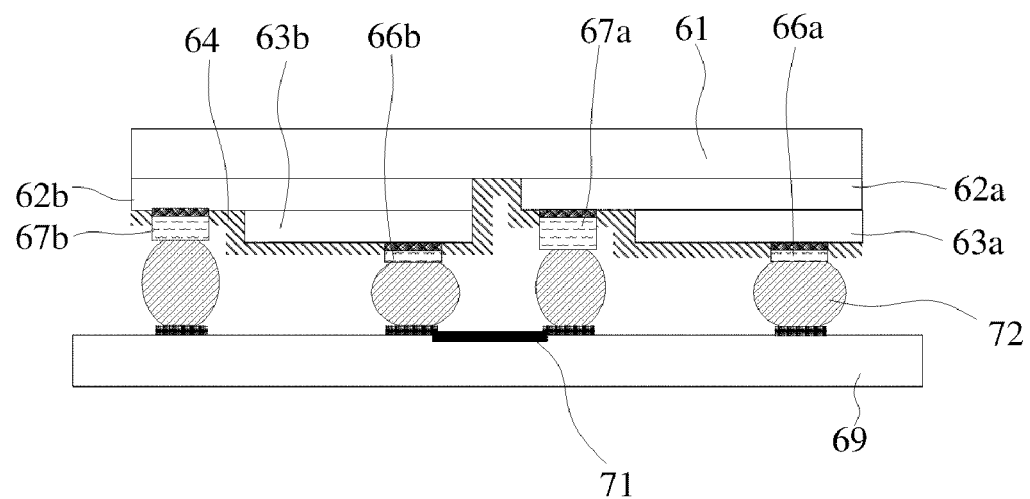
FIG. 7 is a schematic diagram illustrating a flip-chip structure of the AC LED dies shown in FIG. 3.

In addition, the structure of AC LED dies may be covered by a glue as a packaged structure and fixed on a sub-mount 69, wherein the glue may be a heatsink glue and the sub-mount 69 may be formed with a surface that acts as a reflective layer to reflect light. Alternatively, bumps 72 may be formed over the sub-mount 69. Trace 71 are used to connect the n-type pad 67a with the p-type pad 66b, and the n-type pad 67b and the p-type pad 66a are also electrically connected with each other (not shown in the figure) as shown in FIG. 7.

Figure 8:
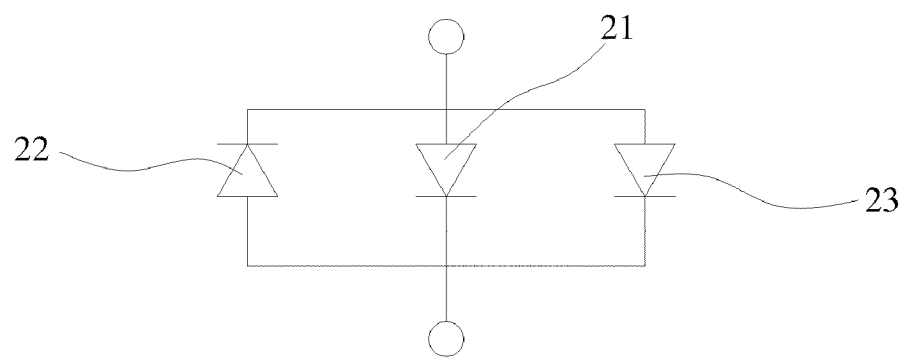
FIG. 8 is a variant of the equivalent circuit shown in FIG. 4A.

In addition, the structure of AC LED dies may be connected with a third LED micro-die 23 in parallel as shown in FIG. 8, and an asymmetric structure of AC LED dies is thus formed.

Figure 9A:
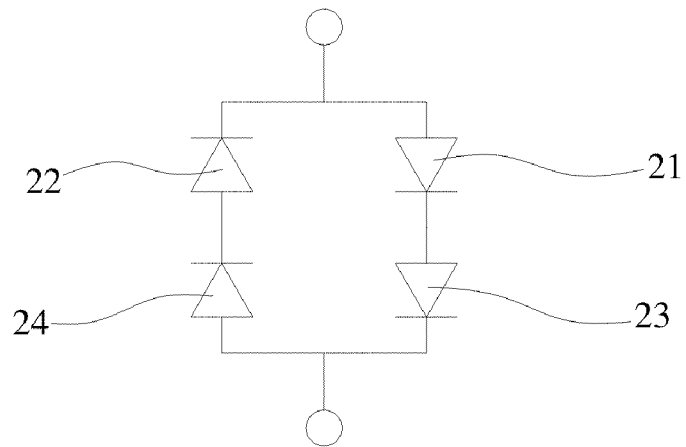
FIG. 9A is the structure of AC LED dies according to another embodiment of the invention.
Figure 9B:
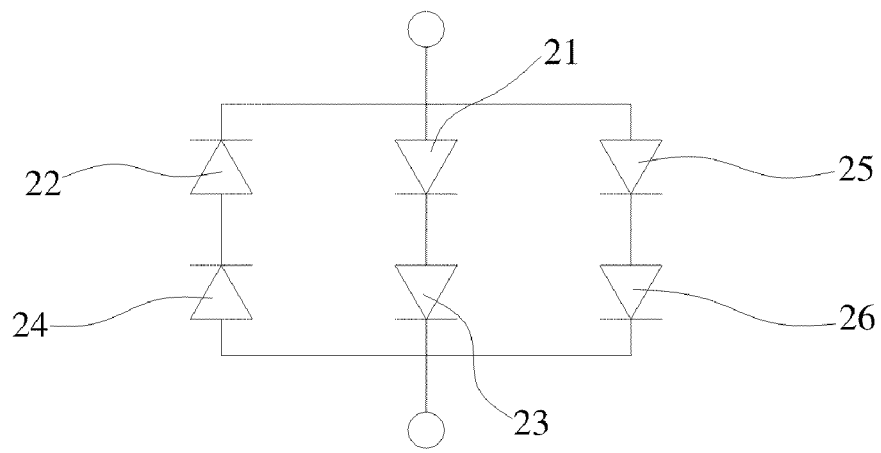
FIG. 9B is a variant of the structure of AC LED dies shown in FIG. 9A.

FIG. 9A illustrates another embodiment of the structure of AC LED dies. In this embodiment, a first LED micro-die 21 is connected with a third LED micro-die 23 and a second LED micro-die 22 is connected with a fourth LED micro-die 24, and the same result as provided by the above mentioned embodiment of the structure of AC LED dies is obtained. Alternatively, the structure of AC LED dies may be further connected with a fifth LED micro-die 25 and a sixth LED micro-die 26 in parallel, similar to that shown in FIG. 8, as shown in FIG. 9B. In the above embodiments, each of the LED micro-dies may emit light with a single wavelength or multiple wavelengths when a power supply is supplied, such as wavelengths corresponding to red, green and blue lights.

Figure 10A:
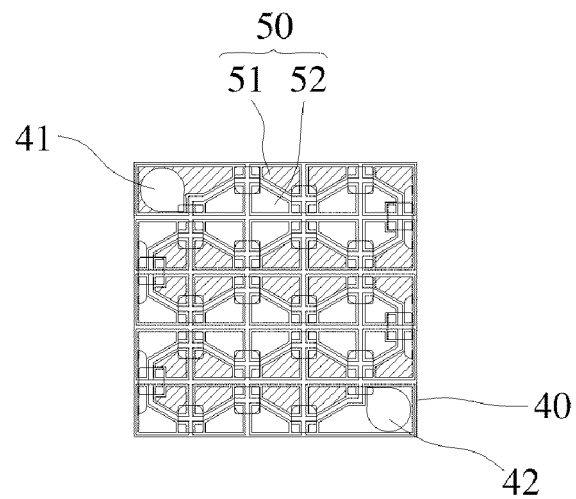
FIGS. 10A and 10B are illustrations of a plurality of structures of AC LED dies connected in a matrix form according to the invention.
Figure 10B:
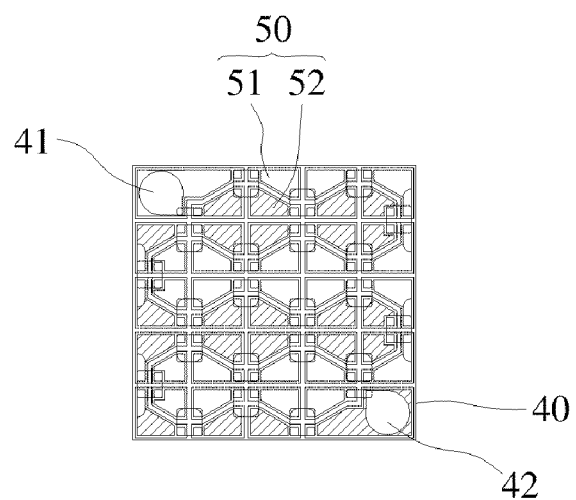
Figure 11:
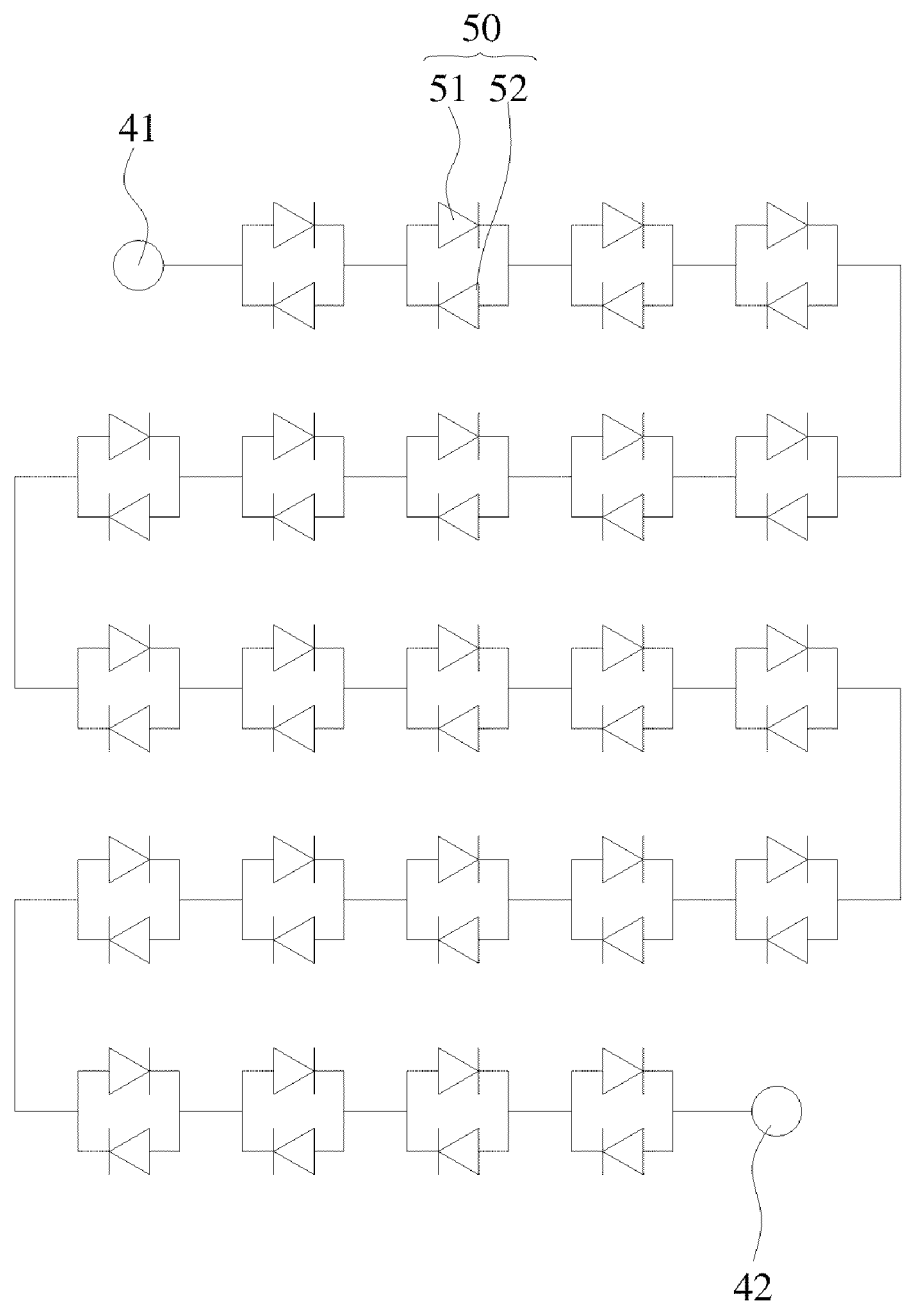
FIG. 11 is an equivalent circuit diagram of the matrix-formed plurality of structures of AC LED dies shown in FIGS. 10A and 10B.

In practical usage, a first pad 41 and a second pad 42 are formed on a substrate 40, and a plurality of units 50 of AC LED dies are coupled therebetween, as shown in FIGS. 10A and 10B. Each unit 50 of AC LED dies comprises a first LED micro-die 21 and a second LED micro-die 22, as shown in FIG. 3, and has an equivalent circuit shown in FIG. 11. Seen from FIG. 11, it may be readily known that the first and second LED micro-dies 21 and 22 are arranged in mutually reverse orientations and connected in parallel, and a plurality of thus formed units 50 is connected in series. Similar to the description in FIG. 3, the first LED micro-die 21 in the unit 50 emits light when a positive-half wave voltage is in the AC power supply, while the second LED micro-die 22 in the unit 50 emits light when a negative-half wave voltage is in the AC power supply (see FIG. 10B). Since the voltage of the AC power supply is varied between a positive peak and a negative peak with a high frequency, light emitted alternatively from the LEDs 21 and 22 is continuous. Generally, AC voltage has a large swing or a large amplitude. Even if the voltage on such a unit 50 connected at the downstream of a wire connecting a plurality of units is slightly dropped, the range of reduction is relatively small, unlike the prior art (only several volts is provided) in which slight changes over the voltage fed into the LED cause a remarkable difference of luminance of the LED. Since the LED has a fast response speed, the AC power supply may have a frequency up to 50-60 kHz. In addition, any waveform of the AC power supply may be used, provided that the waveform is symmetrical.

While the preferred embodiments of the invention have been set forth for the purpose of disclosure, modifications of the disclosed embodiments of the invention as well as other embodiments thereof may occur to those skilled in the art. Accordingly, the appended claims are intended to cover all embodiments which do not depart from the spirit and scope of the invention.

The invention claimed is:

1. A unit of light-emitting diode (LED) micro-dies, comprising:
   a rectangular chip having edges;
   a first LED micro-die, having a first edge, a first anode and a first cathode, the first anode and the first cathode being respectively disposed adjacent opposite ends of the first edge; and
   a second LED micro-die, having a second edge, a second anode and a second cathode, the second edge corresponding to the first edge, the second anode corresponding to and being electrically connected to the first cathode, the second cathode corresponding to and being electrically connected to the first anode, the first LED micro-die and the second LED micro-die being disposed on the rectangular chip and complementing each other in shape so as to occupy a substantially rectangular region,
   wherein angles between two parallel edges of the chip and the first edge are acute angles and angles between the two parallel edges of the chip and the second edge are acute angles, and
   wherein the unit of LED micro-dies emits a light in response to an alternative current (AC) power supply applied to the first cathode and the first anode.

2. The unit according to claim 1, further comprising a first conductive bridge connected between the second anode and the first cathode, and a second conductive bridge connected between the first anode and the second cathode.

3. The unit according to claim 1, wherein the two LED micro-dies emit light of the same wavelength.

4. The unit according to claim 1, wherein the two LED micro-dies emit light of different wavelengths.

* * * * *